United States Patent
Lee

(10) Patent No.: US 7,368,357 B2
(45) Date of Patent: May 6, 2008

(54) SEMICONDUCTOR DEVICE HAVING A GRADED LDD REGION AND FABRICATING METHOD THEREOF

(75) Inventor: Sang Gi Lee, Bucheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/021,056

(22) Filed: Dec. 23, 2004

(65) Prior Publication Data

US 2005/0184335 A1    Aug. 25, 2005

(30) Foreign Application Priority Data

Dec. 24, 2003   (KR) ...................... 10-2003-0096991

(51) Int. Cl.
*H01L 21/336* (2006.01)
(52) U.S. Cl. ...................................... 438/290; 438/305
(58) Field of Classification Search ................ 438/290, 438/291, 305
See application file for complete search history.

(56) References Cited

U.S. PATENT DOCUMENTS 6,180,464 B1 * 1/2001 Krivokapic et al. ........ 438/289
6,300,662 B1   10/2001 Doyle et al.
6,693,001 B2 * 2/2004 Hashimoto et al. ......... 438/199

FOREIGN PATENT DOCUMENTS

JP    2002-353449    12/2002

* cited by examiner

*Primary Examiner*—Jack Chen
(74) *Attorney, Agent, or Firm*—Andrew D. Fortney

(57) ABSTRACT

A semiconductor device and fabricating method thereof in which a lightly doped drain junction is graded using a diffusion property of dopant implanted in heavily doped source/drain region are disclosed. An example semiconductor device includes a gate electrode having a gate insulating layer underneath and disposed on a semiconductor substrate; a pair of lightly doped regions separated from each other in the semiconductor substrate and aligned with the gate electrode; a pair of heavily doped regions separated from each other in the semiconductor substrate and partially overlapped with the pair of the lightly doped regions, respectively; and a pair of diffusion source/drain regions enclosing the pair of the lightly doped regions therein.

19 Claims, 7 Drawing Sheets

SEMICONDUCTOR DEVICE HAVING A GRADED LDD REGION AND FABRICATING METHOD THEREOF

RELATED APPLICATION

This application claims the benefit of the Korean Application No. P2003-0096991 filed on Dec. 24, 2003, which is hereby incorporated by reference.

TECHNICAL FIELD

The present disclosure relates to a semiconductor device, and more particularly, to a semiconductor device and fabricating method thereof in which a lightly doped drain junction is graded using a diffusion property of dopant implanted in heavily doped source/drain region.

BACKGROUND

Generally, the double diffused drain (DDD) structure has been used to improve the hot carrier effect and the like of a semiconductor device having a channel length greater than 0.35 µm. Such a device is not concerned about breakdown voltage (BVDss) between source and drain as well as roll-off of threshold voltage.

More recently, as channel length is shortened to achieve a high degree of integration in semiconductor devices to raise the short channel effect, the DDD structure is being used less. However, it is advantageous for a low power device to have high threshold voltage and BVDss in securing junction leakage. As a result, the DDD structure is employed in part. Yet, the short channel device still has the above-noted difficulty in employing the DDD structure. For instance, a transistor as a low power device having small leakage current tends to employ the LDD (lightly doped drain) structure instead of the conventional DDD structure to enhance the short channel effect due to the reduced channel length. As the junction configuration is modified, the breakdown voltage between source and drain is lowered. This may be explained as follows. When the LDD dopant increases, a junction between N-type LDD and a P-type well is abruptly formed to increase leakage from the junction region. Meanwhile, the known process of implanting additional P-type dopant is mainly used in improving leakage characteristic and capacitance by grading a junction profile, not in the LDD region but in the source/drain region.

FIG. 1A is a cross-sectional diagram of a known semiconductor device having a double diffused drain (DDD) and FIG. 1B is a cross-sectional diagram of a semiconductor device having a lightly doped drain (LDD). Referring to FIG. 1A, an STI layer 16 and an n-well or p-well 11 are formed on a semiconductor substrate. A gate oxide layer 12 is formed 30 Å thick on the substrate, and a polysilicon layer 13 is deposited over the substrate. A gate 13 is then formed by patterning the polysilicon layer by photolithography. Subsequently, a PMOS or NMOS DDD region 14 is formed in the N- or P-well 11 by ion implantation. A sidewall spacer 18 is provided to the gate 13 by depositing a nitride layer over the substrate and by etching back the nitride layer. Subsequently, ion implantation is carried out on the substrate using dopant of As and P ions to form source and drain regions 15 and 19, and silicidation is carried out on the substrate to form a Co-silicide 17 layer on the gate 13 and the source and drain regions 15 and 19.

Referring to FIG. 1B, a process of fabricating a semiconductor device having the LDD structure is similar to that of fabricating the semiconductor device having the DDD structure in FIG. 1A, except forming a PMOS or NMOS LDD region 24 instead of forming the PMOS or NMOS DDD region 14 in FIG. 1A by ion implantation. However, the short channel effect still takes place in case of applying the DDD or LDD structure to the known low power device. Moreover, a high electric field is applied to the LDD region.

DETAILED DESCRIPTION

Figure 1A:
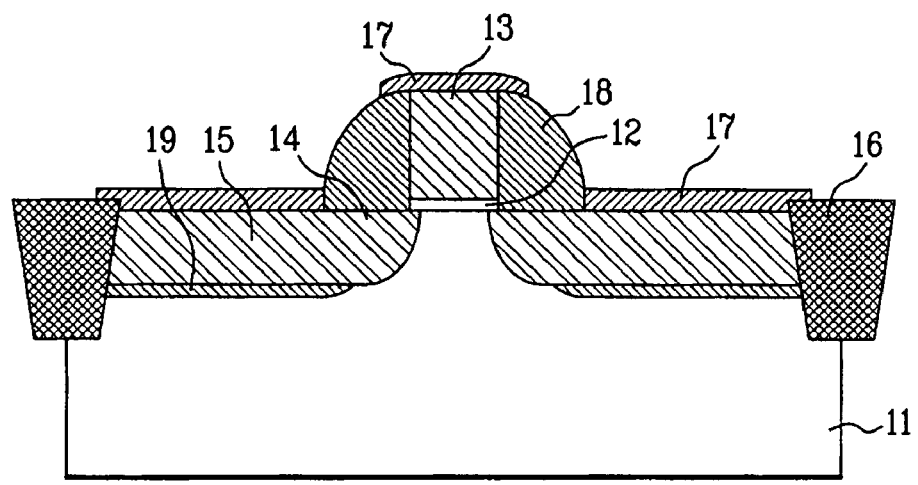
FIG. 1A is a cross-sectional diagram of a known semiconductor device having a double diffused drain (DDD).
Figure 1B:
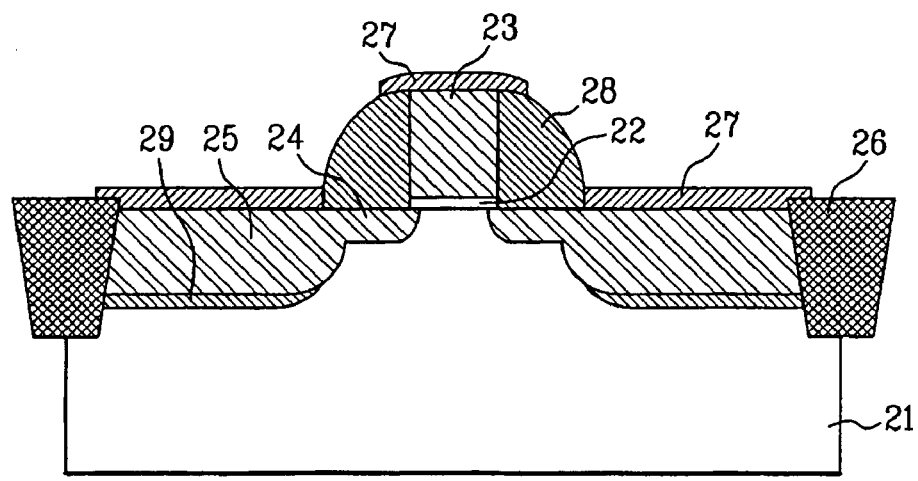
FIG. 1B is a cross-sectional diagram of a semiconductor device having a lightly doped drain (LDD).

In general, the example apparatus and methods described herein provide a semiconductor device and fabricating method thereof, in which an LDD junction is graded using phosphorous dopant diffusion of a source/drain region and by which a roll- of characteristic of threshold voltage is enhanced as well as BVDss.

More specifically, an example semiconductor device includes a gate electrode having a gate insulating layer underneath a semiconductor substrate, a pair of lightly doped regions separated from each other in the semiconductor substrate to be aligned with the gate electrode, a pair of heavily doped regions separated from each other in the semiconductor substrate to be partially overlapped with a pair of the lightly doped regions, respectively, and a pair of diffusion source/drain regions enclosing a pair of the lightly doped regions therein, respectively. Preferably, a pair of the diffusion source/drain regions are heavily doped with additional dopant, which is preferably phosphorous (P). More preferably, junction profiles of the lightly doped regions are graded due to lateral diffusion of the additional dopant.

An example method of fabricating a semiconductor device includes forming a gate electrode having a gate insulating layer underneath on a semiconductor substrate, forming a pair of lightly doped regions separated from each other in the semiconductor substrate to be aligned with the gate electrode, forming a spacer to a sidewall of the gate electrode, forming a pair of heavily doped regions separated from each other in the semiconductor substrate to be partially overlapped with a pair of the lightly doped regions, respectively, heavily doping the heavily doped regions with additional dopant, and diffusing the additional dopant in a lateral direction toward the lightly doped regions to form a pair of diffusion source/drain regions enclosing a pair of the lightly doped regions therein, respectively. Preferably, the additional dopant is phosphorous (P), and, preferably, the additional dopant is diffused to enclose a pair of the lightly doped regions to avoid a double diffused drain (DDD) structure. Preferably, junction profiles of the lightly doped regions are graded due to lateral diffusion of the additional dopant and, preferably, the method further includes the step of forming a silicide layer on the gate electrode and a pair of the heavily doped regions.

The example semiconductor device described herein may be used to improve BVDss, which was degraded by high electric field impression on the source/drain region of the LDD semiconductor device and to improve the short channel effect.

In the example semiconductor described herein, an LDD region is enclosed by the P dopant using lateral diffusion of the P dopant added to a source/drain region, whereby the BVDss characteristic and short channel effect are improved to enhance a process margin.

In the examples disclosed herein, a P dopant is implanted in a source/drain region of a device applicable to a low power device and an LDD region is enclosed by the added P dopant using lateral diffusion of the P dopant. In doing so, the implantation energy and dopant are optimized to form a graded dopant profile of the LDD region to reduce and electric field impressed on the LDD junction, and the dopant profile is graded by lowering a junction depth of the LDD region to prevent the short channel effect and to improve a roll-off characteristic of threshold voltage. In particular, the examples described herein may be used to implement a MOS transistor, of which the roll-off characteristic of the threshold voltage and the BVDss characteristic are improved by using a P dopant diffusion after forming a gate sidewall spacer.

The examples described herein utilize 0.18 μm standard CMOS process and may be fabricated using the operations described below. First, a gate is formed 2,500 Å thick. An N or P-type LDD is formed. A sidewall spacer is provided to the gate. As ion implantation is carried out to form heavily doped source and drain regions. A P dopant is heavily re-implanted to form a diffusion source/drain region. The LDD region is enclosed by the P dopant using lateral diffusion of the P dopant by optimizing a dose and implantation energy of the P dopant.

Figure 2:
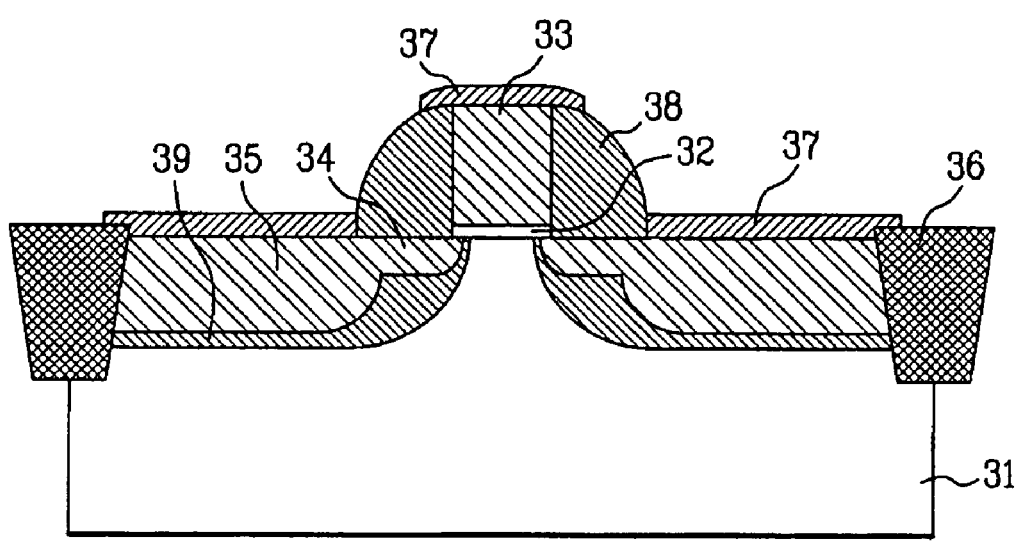
FIG. 2 is a cross-sectional diagram of an example semiconductor device having an LDD region enclosed by a diffusion source/drain region.

FIG. 2 is a cross-sectional diagram of an example semiconductor device having an LDD region enclosed by a diffusion source/drain region. Referring to FIG. 2, a field oxide layer 36 is formed on a P- or N-type single crystalline semiconductor substrate to define an active area for an N or P-well 31. A gate oxide layer 32 is formed on the active area of the substrate by oxidation. A gate electrode 33 of polysilicon is formed on the gate oxide layer 32. LDD regions 34 lightly doped with dopant are formed in the active area of the substrate to be aligned with the gate electrode 33. An insulating layer spacer 38 is provided to a sidewall of the gate electrode 33. Source and drain regions 35 heavily doped with N or P-type dopant are formed in the active area of the substrate to be adjacent to the LDD regions 34, respectively, using As impurity ions, and additional P dopant is implanted in the source and drain regions 35 to enclose the LDD regions therein, respectively. A Co-silicide layer 37 is formed on the gate electrode 33 and the source and drain regions 35 only.

Figure 3A:
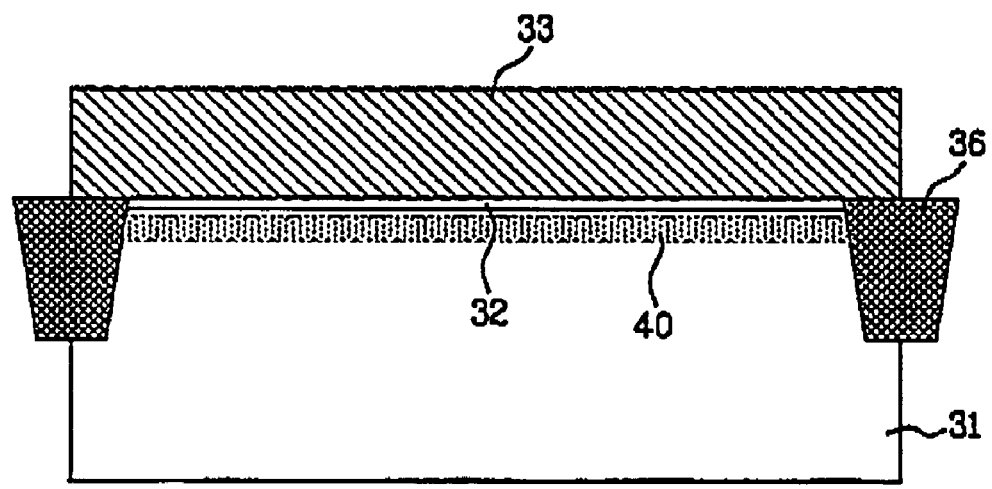
FIGS. 3A to 3G are cross-sectional diagrams depicting an example method of fabricating a semiconductor device having an LDD region enclosed by a diffusion source/drain region.

FIGS. 3A to 3G are cross-sectional diagrams depicting an example method of fabricating a semiconductor device having an LDD region enclosed by a diffusion source/drain region in which the semiconductor device is a MOS transistor. Referring to FIG. 3A, a device isolation layer 36 is formed by a shallow trench isolation (STI) process in a field area on a semiconductor substrate to define an active area therein. In this case, the semiconductor substrate is an N or P-type single crystalline semiconductor substrate. A P or N-well 31 is formed in the active area of the semiconductor substrate. Ion implantation for threshold voltage adjustment 40 is carried out on the semiconductor substrate. A thin oxide layer 32 is formed 30 Å thick on the active area of the semiconductor substrate. A polysilicon layer 33 is formed 2500 Å thick on the thin oxide layer 32.

Figure 3B:
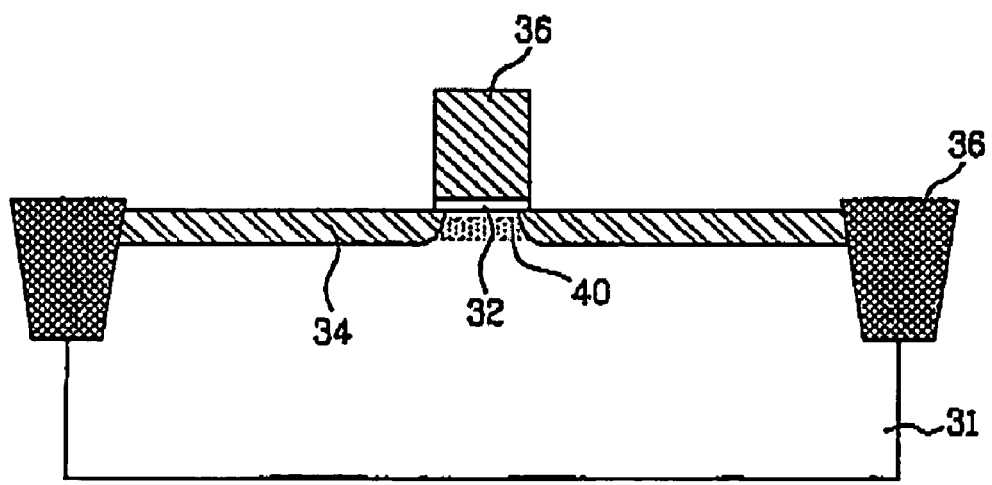

Referring to FIG. 3B, the polysilicon layer 33 is patterned by photolithography to form a gate 33. LDD ion implantation is carried out on the substrate to form LDD regions 34 to be aligned with the gate 33 using the gate 33 as an LDD ion implantation mask.

Figure 3C:
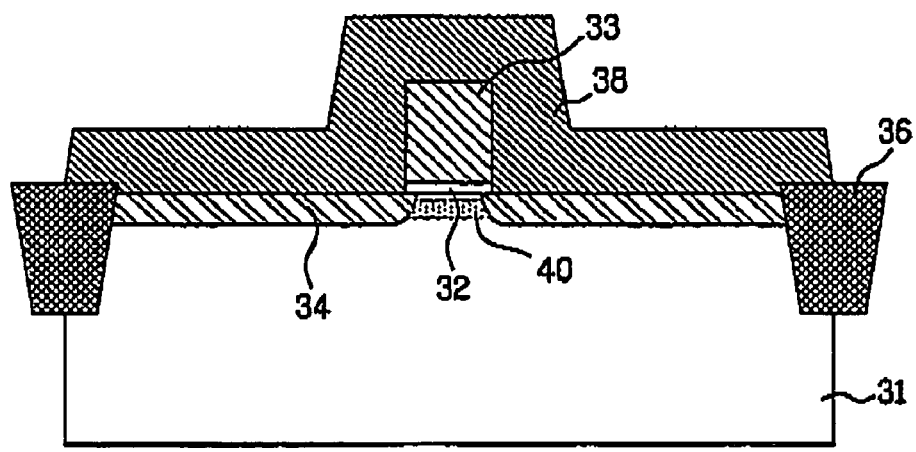

Referring to FIG. 3C, an oxide layer 8 is deposited 1,000~1,300 Å thick over the substrate.

Figure 3D:
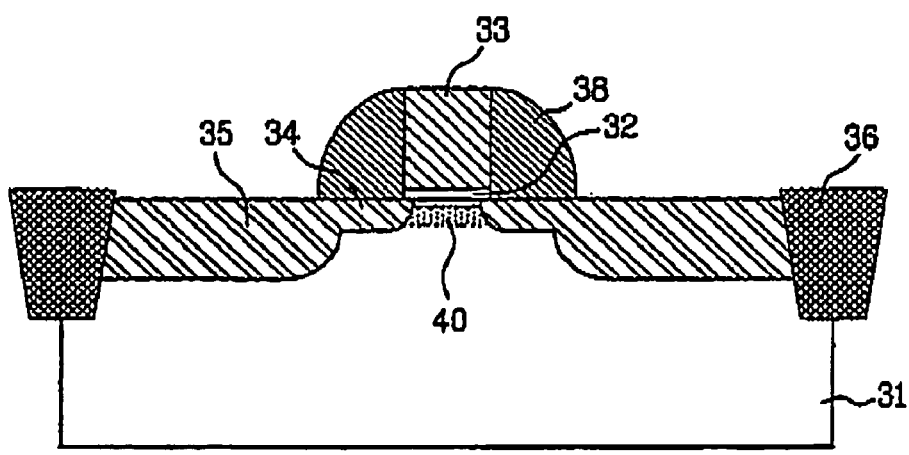

Referring to FIG. 3D, the oxide layer 8 is etched to remain on a sidewall of the gate 33 including the gate oxide layer 32 only to form a sidewall spacer 38. Source/drain ion implantation is carried out on the substrate to form N+ or P+ source and drain regions 35. In doing so, the source/drain regions 35 are aligned with the gate 33 and partially overlapped with the LDD regions 34, respectively.

Figure 3E:
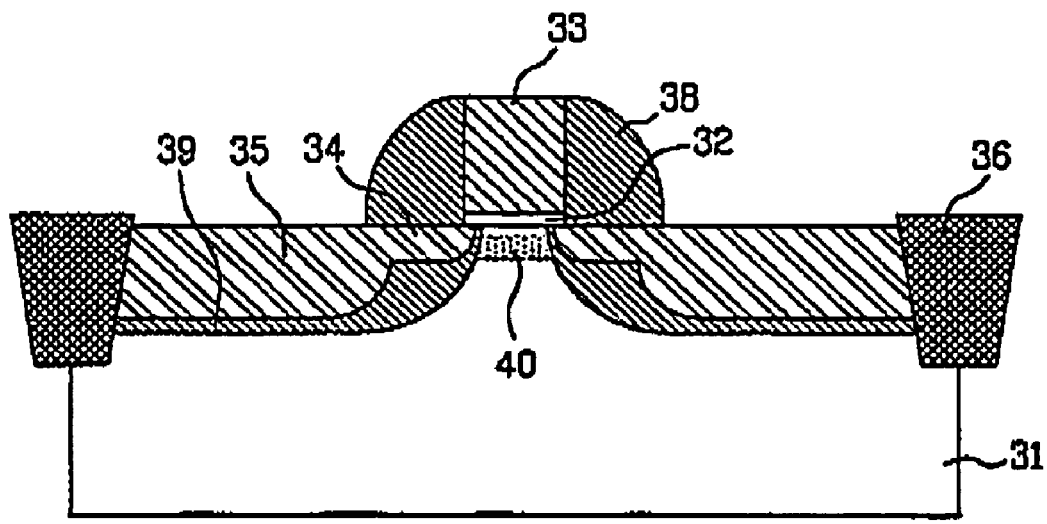
Figure 3F:
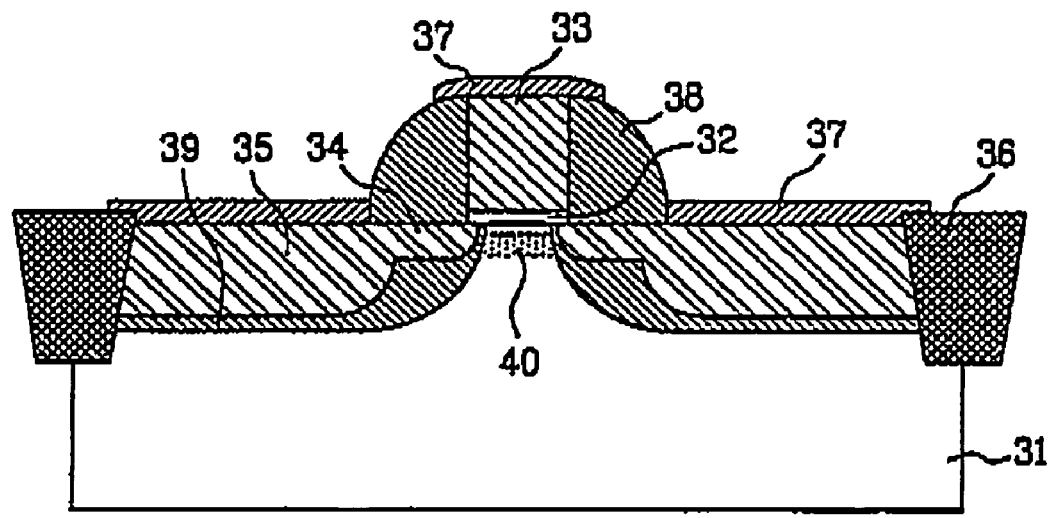

Referring to FIG. 3E, additional P impurity ion implantation is carried out on the substrate to heavily dope the source and drain regions 35 with a P dopant. Hence, diffusion source/drain regions 39 are formed using lateral diffusion of the P dopant.

Figure 3G:
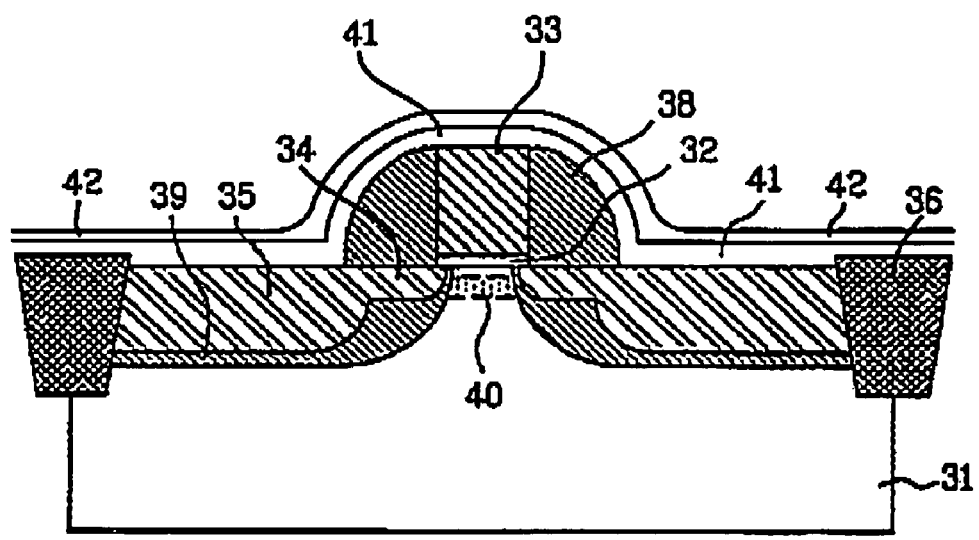

Referring to FIG. 3G, a Co layer 41 is formed 90 Å thick over the substrate, and a TiN layer 42 is stacked 150 Å thick on the Co layer 41. First annealing is carried out on the substrate to form a silicide layer on the gate and the source and drain regions 39. The Co and TiN layers failing to react are removed to form silicide layer 37 as shown in FIG. 3E, and second annealing is carried out on the substrate to complete salicidation.

Namely, to implement a lower power device of a short channel device below 0.18 μm, a P dopant is additionally implanted into the N+ source and drain regions 35 to form the diffusion source and drain regions 39, and a junction profile of the LDD region 34 is graded using the diffusion property of the P dopant. As a result, the examples described herein may be used to raise BVDss to enhance leakage current.

Figure 4:
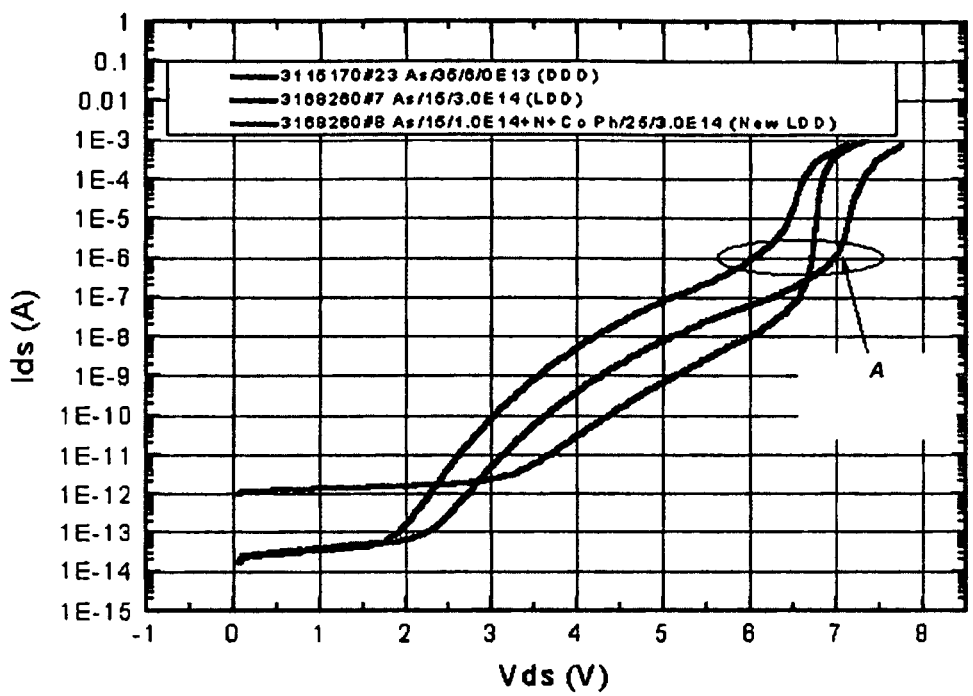
FIG. 4 is a graph of a breakdown voltage between source and drain.

FIG. 4 is a graph of a breakdown voltage (BVDss) between source and drain, in which 'Ids' indicates drain saturation current. Referring to FIG. 4, a curve-A indicates an increment of BVDss in case of the new LDD structure according to the present invention.

Figure 5:
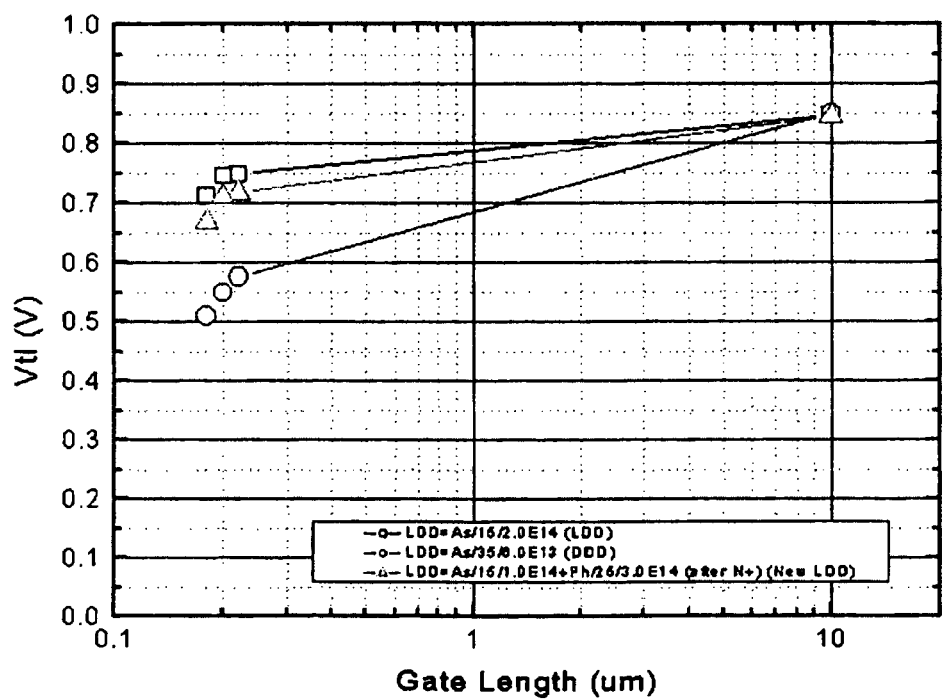
FIG. 5 is a graph for showing short channel effect enhancement in the example semiconductor device described herein.

FIG. 5 is a graph depicting short channel effect enhancement in the example semiconductor device described herein, in which 'Vt1' indicates threshold voltage. Referring to FIG. 5, enhancement of short channel effect is shown in case of the example LDD structure. Accordingly, in the examples described herein, the junction profile of the LDD region is graded to raise the breakdown voltage between the source and drain, whereby the leakage current in the off-state of the MOS transistor can be enhanced. Additionally, the example semiconductor device and method disclosed herein enhances the roll-off characteristic of the threshold voltage of the related art DDD structure. Still further, the example semiconductor device and method described herein applies the P and Co implantation to control the profile of the LDD region.

While the examples herein have been described in detail with reference to example embodiments, it is to be understood that the coverage of this patent is not limited to the disclosed embodiments, but, on the contrary, is intended to cover various modifications and equivalent arrangements included within the sprit and scope of the appended claims.

What is claimed is:

1. A method of fabricating a semiconductor device, comprising:

forming a gate electrode on a gate insulating layer on a semiconductor substrate;

forming a pair of lightly doped regions separated from each other in the semiconductor substrate and aligned with the gate electrode;

forming a dielectric layer on the semiconductor substrate including the gate electrode and removing the dielectric layer to expose upper surfaces of the semiconductor substrate lateral to the gate electrode, thereby forming a spacer on a sidewall of the gate electrode;

implanting ions into the exposed upper surfaces of the semiconductor substrate to form a pair of heavily doped regions separated from each other in the semiconductor substrate and partially overlapped with the lightly doped regions;

heavily doping the heavily doped regions by implanting additional dopant into the exposed inner surfaces of the semiconductor substrate using the gate electrode and the spacer as a mask; and diffusing the additional dopant in a lateral direction toward the lightly doped regions to form a pair of diffusion source/drain regions enclosing the pair of the lightly doped regions therein.

2. The method of claim 1, wherein the additional dopant comprises phosphorous (P).

3. The method of claim 1, wherein the additional dopant avoids a double diffused drain (DDD) structure.

4. The method or claim 1, wherein junction profiles of the lightly doped regions are graded due to lateral diffusion of the additional dopant.

5. The method of claim 1, further comprising forming a silicide layer on the gate electrode and the pair of the heavily doped regions.

6. The method of claim 1, wherein the pair of diffusion source/drain regions have a junction profile encompassing the heavily doped regions.

7. The method of claim 2, wherein diffusing the P dopant improves a roll-off characteristic of a threshold voltage.

8. The method of claim 2, wherein heavily doping with the P dopant is performed at an implantation energy and dose optimized to enclose the lightly doped regions.

9. The method of claim 1, wherein heavily doping with additional dopant is performed at an implantation energy optimized to form a graded dopant profile of the lightly doped regions and reduce an electric field applied to a junction of the lightly doped regions.

10. The method of claim 1, wherein forming the pair of lightly doped regions comprises lowering a junction depth of the lightly doped regions.

11. The method of claim 10, wherein lowering the junction depth of the lightly doped regions effectively grades the dopant profile, prevents a short channel effect and/or improves a roll-off characteristic of a threshold voltage.

12. The method of claim 1, further comprising, prior to forming the gate electrode, forming the gate insulating layer on the active area of the semiconductor substrate.

13. The method of claim 1, further comprising, prior to forming the gate electrode, implanting ions in the semiconductor substrate to adjust a threshold voltage.

14. The method of claim 1, wherein forming the pair of lightly doped regions comprises implanting ions in the semiconductor substrate using the gate electrode as a mask.

15. The method of claim 14, wherein the ions implanted to form the heavily doped regions comprise arsenic (As).

16. The method of claim 5, wherein forming the silicide layer comprises forming a metal layer over the semiconductor substrate, forming a metal nitride layer on the metal layer, and annealing the semiconductor substrate to form the silicide layer.

17. The method of claim 16, further comprising removing unreacted metal and metal nitride layers, and further annealing the semiconductor substrate to complete the silicide layer.

18. The method of claim 16, wherein the metal layer comprises a Co layer having thickness of 90 Å, and the metal nitride layer comprises a TiN layer having a thickness of 150 Å.

19. The method or claim 1, wherein forming the spacer comprises depositing an oxide layer to a thickness of about 1,000 to about 1,300 Å and etching the oxide layer until its uppermost surface is substantially aligned with an upper surface of the gate electrode.

* * * * *